United States Patent [19]

Hurwitt et al.

[11] Patent Number: 5,080,772
[45] Date of Patent: Jan. 14, 1992

[54] METHOD OF IMPROVING ION FLUX DISTRIBUTION UNIFORMITY ON A SUBSTRATE

[75] Inventors: Steven D. Hurwitt, Park Ridge, N.J.; Israel Wagner, Monsey; Robert Hieronymi, Rock Cavern, both of N.Y.

[73] Assignee: Materials Research Corporation, Orangeburg, N.Y.

[21] Appl. No.: 572,850

[22] Filed: Aug. 24, 1990

[51] Int. Cl.$^5$ ............................................. C23C 14/34
[52] U.S. Cl. ........................ 204/192.12; 204/192.13; 204/298.03; 204/298.17; 204/298.18
[58] Field of Search ........... 204/192.1, 192.12, 192.15, 204/192.3, 298.06, 298.16, 298.17, 298.18, 298.19, 298.2, 298.21, 298.22, 298.03, 192.13

[56] References Cited

U.S. PATENT DOCUMENTS

| | | | |
|---|---|---|---|
| 4,060,470 | 11/1977 | Clarke | 204/192 R |
| 4,100,055 | 7/1978 | Rainey | 204/298 |
| 4,385,979 | 5/1983 | Pierce et al. | 204/298 |
| 4,427,524 | 1/1984 | Crombeen et al. | 204/298.06 |
| 4,547,279 | 10/1985 | Kiyota et al. | 204/298 |
| 4,629,548 | 12/1986 | Helmer | 204/298 |
| 4,673,480 | 6/1987 | Lamont, Jr. | 204/298.18 |
| 4,810,347 | 3/1989 | Smith | 204/298 |
| 4,842,703 | 6/1989 | Class et al. | 204/298.18 X |
| 4,865,712 | 9/1989 | Mintz | 204/298.16 |
| 4,957,605 | 9/1990 | Hurwitt et al. | 204/298.16 X |

Primary Examiner—Nam X. Nguyen
Attorney, Agent, or Firm—Wood, Herron & Evans

[57] ABSTRACT

A bias sputter coating apparatus is provided with a cathode target assembly having a central electrode which is maintainable at an adjustable voltage level which is negative with respect to the chamber anode but positive with respect to the cathode voltage and the bias voltage on the substrate. The apparatus is used to manufacture sputter coated articles such as semiconductor wafers. The method provides that the voltage on the central electrode is adjusted to a level which improves the ion flux distribution uniformity on the substrate. The electrode voltage is generally optimized in the range of from −8 volts to −20 volts.

22 Claims, 3 Drawing Sheets

METHOD OF IMPROVING ION FLUX DISTRIBUTION UNIFORMITY ON A SUBSTRATE

The present invention relates to sputter coating, particularly bias sputter coating, and more particularly, to a control of ion flux distribution uniformity in bias sputter coating applications, particularly in magnetron enhanced bias sputter coating applications.

BACKGROUND OF THE INVENTION

Sputter coating is a process carried out in a vacuum chamber which is filled with a generally chemically inert gas in which a substrate is coated with a material for a target of sputtering material subjected to a negative electrical potential with respect to the chamber wall or other anode. The potential gradient adjacent the target surface causes electrons to be emitted from the target which, on their way to the chamber anode which is usually formed in part by the grounded chamber wall, strike and ionize some of the inert gas. The positive ions formed are then attracted to the negative target which they strike, transferring momentum to the target material, and ejecting particles of the material from the target surface. The substrate to be coated, which is positioned in the chamber usually with its surface facing the target, receives some of the ejected particles which adhere to and coat the substrate surface.

With magnetron sputtering, a magnetic field is formed over the target surface, usually including magnetic field lines parallel to the target surface, and, in many applications, in the form of a closed magnetic tunnel. The magnetic field causes the electrons emitted to move in curved spiral paths which trap them in regions proximate the target surface enclosed by the field, thereby increasing the rate of electron collisions with gas atoms, which in turn increase the ionization of the gas and the efficiency of the sputtering process.

In the commonly assigned and copending U.S. patent application Ser. No. 07/339,308, filed Apr. 17, 1989, entitled "Method and Apparatus for Sputter Coating Stepped Wafers", expressly incorporated herein by reference, a sputter coating apparatus and method are disclosed in which a concave annular target is provided with concentric annular electromagnets which cause the formation of a pair of concentric plasma rings. The plasma rings are alternately energized by alternately supplying current to energize the magnet coils while the target power level is switched in synchronization with the switching of the current to the magnetic coils. This causes different rates of sputtering from inner and outer concentric regions of the target surface, with the sputtering from each region causing different distribution characteristics of the sputtered material deposited on the substrate or wafer being coated. Varying the relative parameters affecting the energization of the two target regions provides control of coating uniformity on the substrate surfaces, which is especially important on the differently facing surfaces of stepped semiconductor wafers. The aforereferenced patent application particularly describes effects on the coating caused by the target geometry and by the electrical parameters relating to the energization of the target and plasmas.

In bias sputtering, a voltage which is negative, but less negative than that imposed on the target, is applied to the substrate being coated. This bias voltage causes a certain amount of "back sputtering", or sputtering from the sputter coating which has been deposited on the substrate surface, due to the impingement of ions produced by electrons emitted from the substrate. Frequently, however, particularly where the sputtering target is annular with an annular or other closed magnet trap over its surface, pole pieces behind the target produce magnetic fields which shape "primary" plasmas near the target surface and produce a fringing field in the vicinity of the substrate surface which is non-uniform. Components of the fringing field so produced are perpendicular to the substrate surface in certain regions, as for example, at the center on the axis of the target magnet center pole. This fringing field and other portions of the electric and magnetic fields tend to concentrate regions of "secondary" plasma formation which produces a secondary ion flux bombardment of the substrate. The result is often an undesired non-linear distribution of ion flux on the substrate surface.

A solution to the problem of non-uniform ion flux distribution on the surface of the substrate is described in the commonly assigned U.S. Pat. No. 4,871,433 entitled "Apparatus for Improving the Uniformity of Ion Bombardment In a Magnetron Sputtering System". In that patent, the use of a secondary magnet behind or around the substrate having certain characteristics is described. The secondary magnet, or countermagnet, modifies the fringing field produced by the cathode or target primary magnet to render the ion flux uniform on the substrate. While effective, the apparatus in that patent is somewhat specific to the cathode and cathode magnet arrangement, is large and difficult to fit into many processing chamber arrangements, and often must be replaced when the target magnet scheme is changed. Furthermore, the level of ion flux which is provided with such a countermagnet system is limited.

Certain sputter coating devices of the prior art which employ annular sputtering targets employ the use of an anode at the target center. The anode is provided to avoid heating of the wafer due to secondary electron bombardment of the wafer. Such targets are provided with what is called a dark space shield which surrounds the target at its outer rim to absorb electrons which stray from the plasma, preventing them from striking the substrate surface. The anodes provided at the target centers are maintained at the same grounded or other anode potential of the dark space shield to absorb stray electrons near the target center. Such electrons, if not kept from the substrate, while heating the surface, are thought to collect on the surfaces of layers deposited onto conductive substrates, eventually causing a breakdown of the non-conductive material and damage to the substrate surface. These prior art electrodes were also placed to critically intercept some of the plasma trapping field lines, generally reducing their effectiveness.

SUMMARY OF THE INVENTION

It is an objective of the present invention to provide uniform ion flux distribution on the surface of a substrate wafer being coated in a sputter coating process, particularly a bias sputter coating process performed with a magnetron enhanced sputter coating device.

It is a particular objective of the present invention to provide ion flux distribution uniformity on a substrate surface with a method that is sufficiently flexible to accommodate target assemblies of various magnetic, electrical and geometric configurations, and can accommodate target energization methods which change during the sputtering process being performed.

According to the principles of the present invention, a sputter coating apparatus is provided with an electrode disposed generally remote from the outer edge or rim, and preferably on the center line, of the target, near the target surface. The electrode is biased to a voltage which differs from, and is preferably negative with respect to, the sputtering chamber anode and the potential of the dark space shield surrounding the target rim, but which is not as negative as the potential on the target itself. Preferably, the central electrode is biased at a negative voltage which lies between a negative voltage greater in magnitude than zero and a negative voltage of about twenty volts ($-20$ v.), often preferably in the range of about negative eight ($-8$ v.) volts. This compares with a corresponding target voltage which is usually at an approximate negative potential of several hundred volts.

Further, in accordance with the preferred embodiment of the present invention, a switched two plasma annular target with alternately energized concentric inner and outer annular plasma rings is provided with a central electrode which is energized at a negative potential, particularly when the outer plasma is energized. When energized at a substantially less negative potential than the target, the central electrode absorbs stray electrons which, during energization of the outer plasma, are too remote from the outer dark space shield to be captured by it, thereby reducing stray electron bombardment of the target from energization of the outer plasma. The energization of the central electrode is, however, switched to a more nearly ground potential when the inner plasma is energized because stray electrons from the outer plasma are not required to be captured in the center of the target.

Further, according to the present invention, the voltage of the central electrode is maintained at a negative value which, it has been found, is effective to cause positive ions to be attracted toward the electrode. More importantly, an effect of the biased central electrode, so positioned, is that it renders the distribution of ion flux on the substrate surface uniform without the need for a specially configured countermagnet structure near the substrate.

The optimal electrode voltage is determined preferably empirically by adjusting the electrode voltage and measuring ion flux across the surface of the substrate. The negative voltage applied to the central electrode is different with different targets and different energization schemes of the target. By use of the negatively biased central electrode, the negative voltage may be changed as the conditions are changed to optimize the shapes of the electric fields to thereby affect and maintain ion distribution uniformity on the substrate surface being coated.

These and other objectives of the present invention will be more readily apparent from the following detailed description of the drawings in which:

DETAILED DESCRIPTION OF DRAWINGS

Magnetron sputtering devices of the type to which the present invention relates are described in the following commonly assigned U.S. patents and copending patent applications which are hereby expressly incorporated in their entirety into this application by reference:

U.S. Pat. No. 4,853,033 for "Cathode Target Design for a Sputter Coating Apparatus";

U.S. Pat. No. 4,871,433 for "Apparatus for Improving the Uniformity of Ion Bombardment In a Magnetron Sputtering System";

U.S. Pat. No(s). 4,909,675 and 4,915,564 entitled "Method and Apparatus for Handling and Processing Wafer-Like Materials": and, U.S. patent application Ser. No. 07/339,308, filed Apr. 17, 1989 entitled "Method and Apparatus for Sputter Coating Stepped Wafers."

Figure 1:
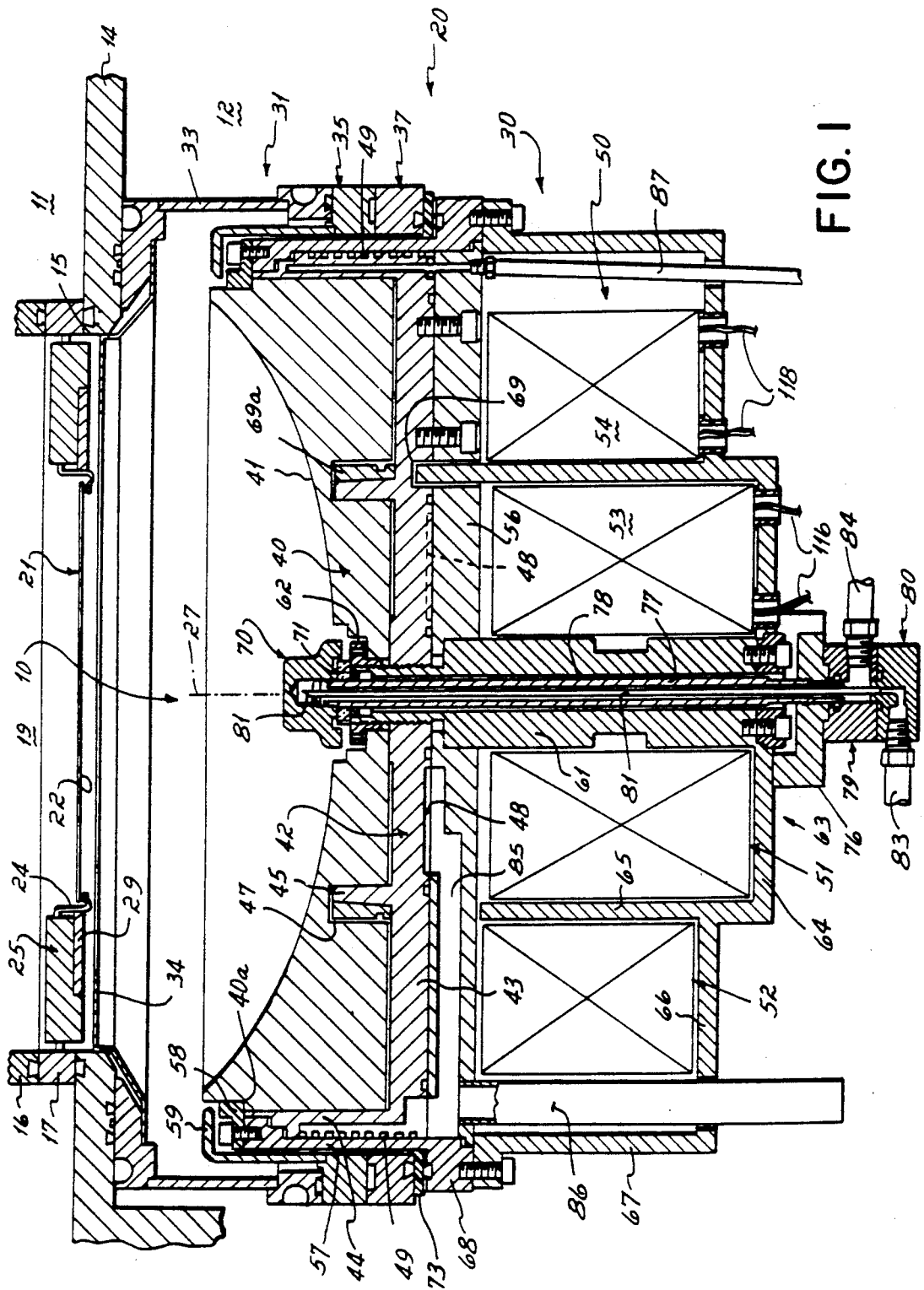
FIG. 1 is a cross-sectional view of a processing chamber of a sputter coating apparatus according to principles of the present invention.

FIG. 1 illustrates, in cross-section, a sputter coating processing chamber 10 of a sputter coating apparatus according to principles of the present invention. The chamber 10 is a portion of the sputter processing apparatus disclosed in U.S. Pat. No. 4,909,675. The processing chamber 10 is a vacuum processing chamber formed of an isolated section of a main chamber 11. The main chamber 11 is isolated from the atmosphere of the machine environment 12 by a plenum wall 14. The processing chamber 10 is capable of communicating with the main chamber 11 throughout opening 15 in the plenum wall 14. The opening 15 is generally circular. The processing chamber 10 is capable of being selectively isolated from the main chamber 11 by the selective movement of a processing chamber back plane section 16 against a portion of a disk shaped rotary wafer transport member 17 clamping the transport member 17 between the backplane section 16 and the plenum wall 14 in a sealing relationship, thereby enclosing a back plane space 19 within the processing chamber 10 and isolating the processing chamber 10 from the main chamber 11.

Opposite the backplane section 16, on the front plane side of the transport member 17, the processing chamber 10 is isolated from the machine environment 12 with a cathode assembly module 20 mounted in a vacuum sealing relationship against the plenum wall 14 surrounding the opening 15. The module 20, or processing chamber frontplane section, cooperates with the backplane section 16 and the transport member 17 to form the sealed isolated processing chamber which is isolated from both the main chamber 11 and the machine environment 12. Within the processing chamber 10 is a workpiece 21 in the form of a flat silicon wafer or disk which has the surface 22 upon which a coating is to be deposited in a sputter coating process to be performed within the processing chamber 10. The wafer 21 is held by a set of clips or other retaining devices 24 in a wafer holder 25 resiliently carried by the transport member 17. The transport member 17 is rotatable within the main chamber to bring the holder 25, and the workpiece or wafer 21 into alignment with the hole 15 so that the processing chamber 10 can be formed around the wafer 21 on the holder 25 by transverse movement of the backplane section 16 to move the member 17 against the plenum wall 14. (The transport member portion 17 is a transversely movable ring carried by a rotatable index plate which is not shown.) In this preferred embodiment, the wafer 21 is supported in a plane perpendicular to, and concentric with, a central axis 27 of the main chamber 10, which is also concentric with the hole 15 in the plenum wall 14. Surrounding the wafer 21 on the holder 25 is a disk 29 which at least partially protects the holder 25 from an excessive accumulation of coating intended for but which missed, the surface 22 of the wafer 21. Details of the sputtering apparatus of which the processing chamber 10 is a part including particularly details of the wafer transport 17, wafer holder 25, and back plane section 16, are described and illustrated in the U.S. Pat. No(s). 4,909,675 and 4,915,564 incorporated by reference above.

The cathode assembly module 20 includes two assemblies, a removable cathode assembly 30 and a fixed assembly portion 31. The fixed assembly portion 31 is an annular enclosure rigidly mounted in sealed relationship against the plenum wall 14 surrounding the opening 15. It includes a cylindrical metal side wall 33 of the chamber 10 which is electrically grounded to the frame 14 of the plenum, a wafer holder shield 34 which surrounds the opening 15 and a chamber door frame assembly 35.

The cathode assembly 30 is mounted to a hinged door assembly 37 which removably but sealably supports the cathode assembly 30 to the fixed assembly 31. The cathode assembly 30 carries the sputtering target 40, which is an annular concave target having a continuous smooth concave sputtering surface 41. The assembly 30 supports the target 40 with its axis in alignment with the axis 27 of the chamber 10 and with its sputtering surface 41 facing the surface to be coated 22 of the wafer 21.

The target 40 is supported in a target holder or nest 42 having a generally circular back plate 43 concentric with the axis 27. The target holder 42 has an outer cylindrical wall 44 and an upstanding cylindrical midwall 45. The outer wall 44 surrounds the outer rim of the target 40. The target 40 has an outer cooling surface which, when the target 40 is mounted in holder 42 and expanded to operating temperature, conforms to and lies in close cooling contact with the inner surface of the holder 42. An annular groove 47 on the back of the target 40 lies in partial contact with the midwall 45 of the holder 42. The target holder or nest 42 has a plurality of annular grooves 48 in its back surface and annular grooves 49 on the outside of its outer wall 44 for the circulation of cooling liquid, which is generally water, to remove heat generated in the target 40 during sputtering by cooling the heat conductive target holder 42. The shapes of the surfaces of the target 40 are preferably such that all the target 40 is capable of being formed by turning block of sputtering material on a lathe. The target holder 40 is made of a heat conductive and electrically conductive material, preferably hard tempered OFHC copper or Alloy 110. The target 40, when operationally heated, expands and preferably plastically deforms into a shape which conforms tightly to the interior cavity of the holder 42 and thereby cooperates with the holder 42 to conduct heat thereto. The cooperation of the holder 42 and the target 40 are preferably as described in U.S. Pat. No. 4,871,433 incorporated by reference above.

The target assembly 30 is provided with a magnet assembly 50 which preferably includes a pair of concentric annular magnets 51 and 52, preferably electromagnets having annular inner and outer windings 53 and 54, respectively, lying concentrically in a plane behind the target holder 42 and centered about and perpendicular to the axis 27. A rigid ferrous material, such as 410 annealed stainless steel, forms the structural support of target assembly 30 and constitutes the magnetic pole pieces of the magnets 51 and 52. This ferrous material includes a circular center plate 56, which forms the planar rear support of the assembly 30 and sustains the transverse magnetic field between pole pieces of the magnets 51 and 52. A cylindrical outer pole piece 57 is welded to the plate 56 at the outer edge thereof to stand upwardly therefrom and to surround the outer wall of the holder 42. A target outer retainer ring 58, is bolted to the upper edge of the outer pole piece 57, so as to rest on an outer annular lip 40a of the target 40 to retain the target 40 in the nest 42. The upper exposed surface of the outer pole piece 57 and ring 58 is shielded by a metal dark space shield 59, which prevents sputtering of the pole piece 57 or retainer ring 58. The dark space shield 59 is rigidly secured to the chamber wall 33 and thereby electrically grounded.

An inner cylindrical pole piece 61, having as its axis the axis 27, projects through the inner rim of the target 40. This pole piece 61 is threaded through the center of the holder 42 below the target 40, and has threaded thereon, above the target 40, a center retainer nut 62 which retains the target 40 at its center hole. The center pole piece 61 has bolted to the bottom end thereof a pole cap assembly 63. The pole cap assembly 63 includes a circular inner plate 64, a cylindrical lower middle pole piece 65 welded at its base to the outer edge of the plate 64, an annular outer plate 66 welded at its inner edge to the outside of the lower middle pole piece 65, and a lower cylindrical outer pole piece 67 welded at its base to the outer edge of the annular plate 66. The lower outer pole piece 67 has bolted to its upper edge, base 68 of outer pole piece 57. The components 64, 65, 66 and 67 of the pole cap 63 have a common axis lying on the axis 27 of the chamber 10.

The middle cylindrical pole piece 65 underlies the annular groove 47 in the back of the target 40, and projects either in a continuous annular ring or at spaced intervals through the plate 56 into a recess 69 in the back surface of the holder 42. A ring 69 of rigid ferromagnetic material and having approximately the same diameter as that of the middle pole piece lies in, and is embedded within, the annular groove 47 in the back surface of the target 40. The upper end of the middle pole piece 65 lies in the annular groove through the surface of the backplate 56 close to the ring 69a. The ferromagnetic ring 69 surrounds the midwall 45 of the holder 42 in the groove 47 in the back of the target 40.

The middle pole piece 65 together with the ring 69a form a pole piece which the inner and outer magnets 51 and 52 have in common. The ring 69a is magnetically coupled to the middle pole piece 65 so as to extend the effective pole piece at the annular groove 47 of the target 40 to very near, but beneath, the surface 41 of the target 40. In that the ferromagnetic ring 69a is of a rigid ferromagnetic material, it is substantially stronger structurally than the soft copper of the holder 40 is made of a material which expands less when heated. As such, it serves to structurally reinforce the midwall 45 of the target holder 42 against radial expansion caused by the heating of the target 40, thereby also restraining the target 40 against radial thermal expansion.

Concentrically mounted at the top of the center pole piece 61 is a central electrode 70, electrically insulated from the pole piece 61 by a ceramic washer 71. The center pole piece 61, the target 40, the holder 42 and the entire center plate 56 and pole cap assembly 63 are energized to the same cathode potential. Accordingly, the assembly 30 is insulated from the grounded fixed assembly 31 by a Teflon insulated annular spacer 73.

A center pole cap 76 is fixed to the bottom of the pole cap assembly 63, concentric with the axis 27. The cap assembly 63 supports an outer cooling fluid tube 77 which extends vertically through a bore 78 in the central pole piece 61 to the electrode 70 with which it makes electrical contact. The tube 77 is electrically conductive and insulated from the cap 76 to provide for the energizing of the electrode 70 at a potential which is different from the target 40 or the grounded chamber wall 33. Mounted to the bottom of the cap 76 is an outlet tube assembly 79 for transmitting cooling fluid from the tube 77. An inlet assembly 80, connected to the base of the outlet assembly 79 supports an inlet tube 81 which extends through the center of the tube 77 to the electrode 70 to supply cooling fluid thereto. A water inlet 83 and outlet 84 are provided in the inlet assembly 80 and outlet assembly 79 respectively. Similarly, cooling passages 85 are provided in the plate 56 for communicating cooling water from passages 48 and 49 to a cooling water outlet 86 in the plate 56. A cooling water inlet 87 communicates water through a grinder inlet duct to the passages 48 and 49 in the holder 42.

Figure 2:
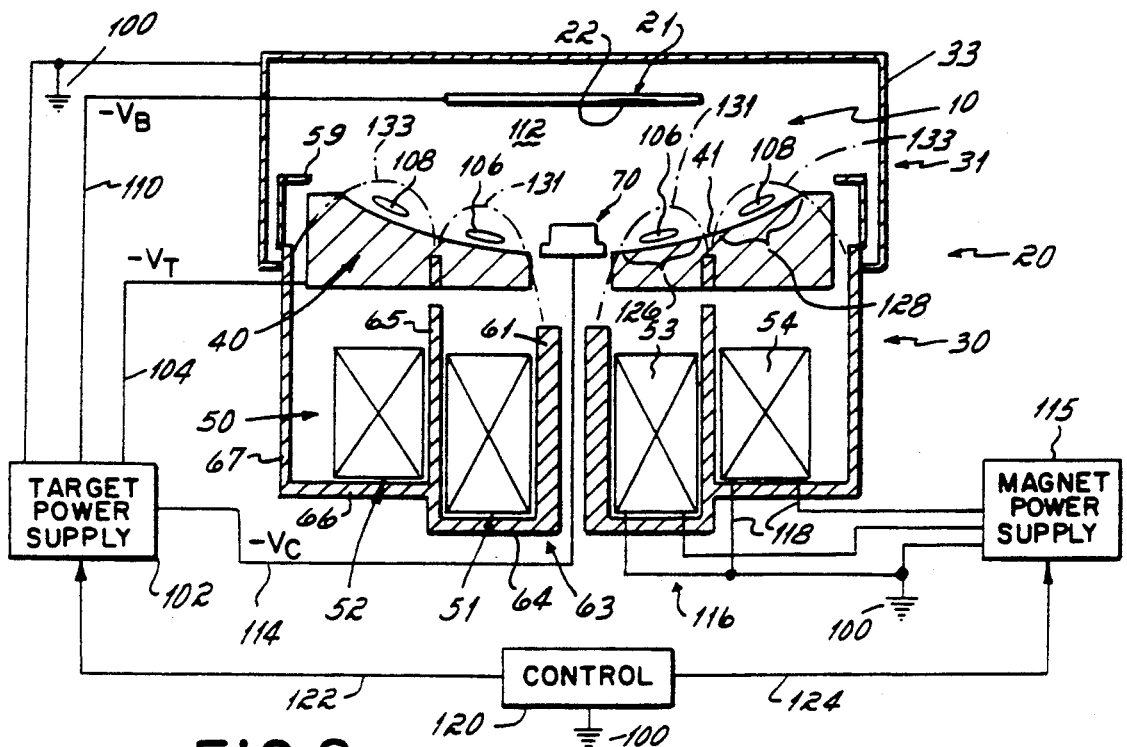
FIG. 2 is a diagram illustrating the electrical circuit arrangement of the embodiment of FIG. 1.

The electrical circuitry of the sputter processing portion of the apparatus is illustrated in the diagram of FIG. 2 which shows the sputtering chamber 10 with its wall 33 maintained electrically at ground potential through a system ground connection 100. A target power supply 102 supplies energy at a negative potential of, typically, several hundred volts through conductor 104 to the target 40. This voltage results in a flow of current manifested in part as a flow of electrons from the surface 41 of the target 40 into a one or more plasmas 106, 108 maintained over the target surface 41 and by an ion flux from the plasmas 106, 108 onto the surface 41 of the target 40. The plasmas 106, 108 are ionized clouds of the chamber gas formed as electrons collide with the gas atoms stripping other electrons from them.

The wafer 21 is connected so as to be maintained closer to ground potential but, for bias sputtering, is biased so as to be substantially negative relative to ground in the range of from 50 to 100 negative volts, −100 volts in the illustrated example. The bias potential is supplied through a conductor represented as line 110 from the power supply 102. A current in the circuit through line 110 is a resultant, in part, of an emission of a small quantity of electrons from the surface 22 of the wafer 21 and a secondary flow of ions onto the surface 22 from a space 112 near the surface 22. The secondary ions are the result of collisions of the electrons emitted from the wafer 21 with gas in the space 112. The current may also result, in part, from electrons and ions striking the surface 22 of the wafer 21 from the regions of the plasmas 106 and 108.

The power supply 102 also is provided with an output 114 for applying a potential to the central electrode 70. This potential is preferably a negative potential of from −0 volts to −20 volts or greater in magnitude. Current through line 114 is a result, in part, of electrons flowing onto the electrode 70 which stray from the more negatively charged target 40 and plasmas 106, 108 to which they return through the conductor 104, completing the circuit. This current is believed, however, to be more largely the result of ions attracted to the electrode 70 from the plasmas 106, 108. Typically, this current is in the range of from 10 to 100 milliamps. Similarly, some current flow in circuits through the conductors 104, 110 and 114 via the system ground 100 as a result of electrons and ions striking the chamber wall 33, the dark space shield 59 and other grounded components of the chamber 10.

Also provided are one or more magnet power supplies 115 for activating the magnet windings 53 and 54 by supplying current to them through leads 116, 118 respectively, and control circuitry 120 for controlling the operation of the power supplies 102 and 115 with control signals supplied through signal lines represented as 122 and 124 respectively in FIG. 2. The circuits 115 and 120 also have grounds connected to the system ground 100.

Figure 3:
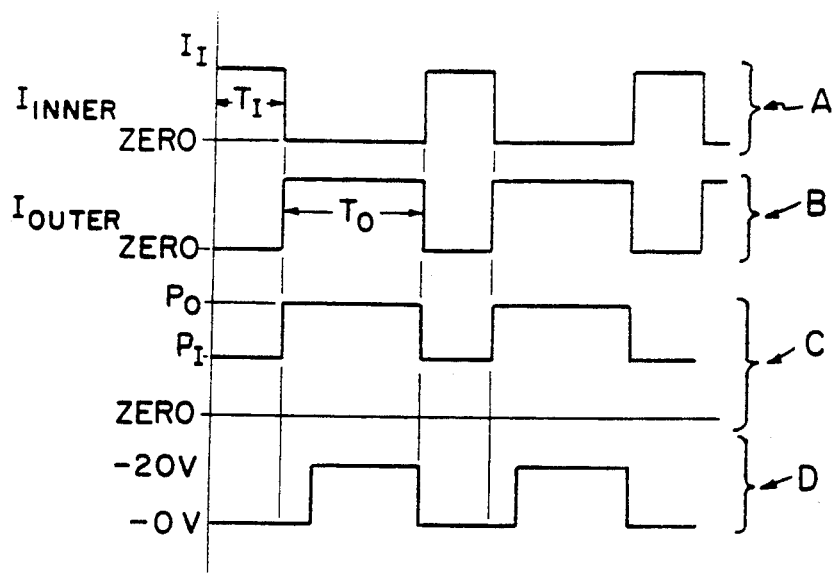
FIG. 3 is a diagram illustrating the waveforms or timing of the switching of the target, wafer and electrode voltage with the circuit arrangement of FIG. 2.

In the preferred embodiment of the invention, only one of the plasmas 106, 108 is energized at a time. This is achieved by switching the current to the magnet windings 53, 54 on and off alternately with signals from the controller 120 through line 124 to the magnet power supply 115. The currents to the magnet windings 53, 54 are switched to different current levels $I_I$, $I_O$ and for differing "ON"-time $T_I$ and $T_O$ as represented by the graphs A and B of FIG. 3. This causes the sputtering to alternate between two respective annular regions 126, 128 of the surface 41 of the target 40 underlying the respective plasma rings 106, 108. In synchronization with this switching, the power level of the target 40 is switched between two levels, $P_I$, $P_O$, as illustrated in graph C of FIG. 3, so that the power is separately maintained during sputtering from the respective inner and outer target regions 126, 128. The control of the switching of the power level at the output 104 of power supply 102 is maintained by a signal on control line 122 from controller 120.

In the performance of a sputter coating operation in a sputtering chamber 10, it is usually desired that electrons emitted from the surface 41 of the target 40 be trapped and remain entrapped in the plasmas 106, 108. The provision of the magnets 51, 52 generate, when their coils 53, 54 are energized, magnetic fields 131, 132 which form arched closed loop magnetic tunnels in the shape of annular rings on the target surface 41 as determined by the placement of the concentric pole pieces 61, 65 and 67. This applies to structures, such as in the embodiment shown herein and more particularly described in U.S. patent application Ser. No. 07/339,308 incorporated above where the plasmas are alternately switched on and off, or where they are energized simultaneously, such as that described in U.S. Pat. No. 4,595,482. It further applies to single plasma structures such as shown in U.S. Pat. No. 4,673,480.

Electrons which do not remain in the plasmas move toward the less negatively charged components of the chamber 10, some of which strike and are absorbed by the substrate 21. Electrons which strike the substrate may result in currents which cause unwanted heating of the substrate, or may collect, where the substrate or a deposited layer of the substrate are non-conductive, building up charge and causing eventual voltage breakdown and damage to the wafer.

To prevent stray electrons from striking the substrate, the dark space shield 59 is conventionally provided and grounded to attract and absorb the electrons. In that the shield 59 is remote from the inner plasma of a two plasma target system such as that of FIG. 2 or of U.S. Pat. No. 4,595,482, a central anode, such as electrode 70, will also absorb electrons which stray near the center of the target surface 41, where the dark space shield may not be able to attract and absorb them. This is usually done by grounding the central electrode or otherwise connecting it to the same potential as the dark space shield. With single plasma systems as shown in U.S. Pat. No. 4,673,480 and illustrated diagrammatically in FIG. 2A, where stray electrons near the center of the target 40A are too remote from the dark space shield 59A to be absorbed by it, a central anode 70A, connected to the same potential as the shield 59A will absorb the electrons near the wafer center.

Figure 2A:
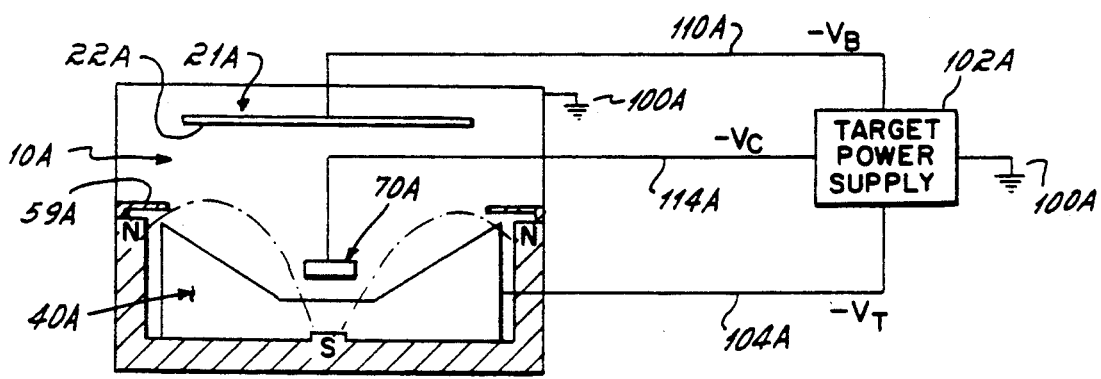
FIG. 2A is a is a diagram similar to FIG. 2, illustrating an alternative application of the present invention.
Figure 4:
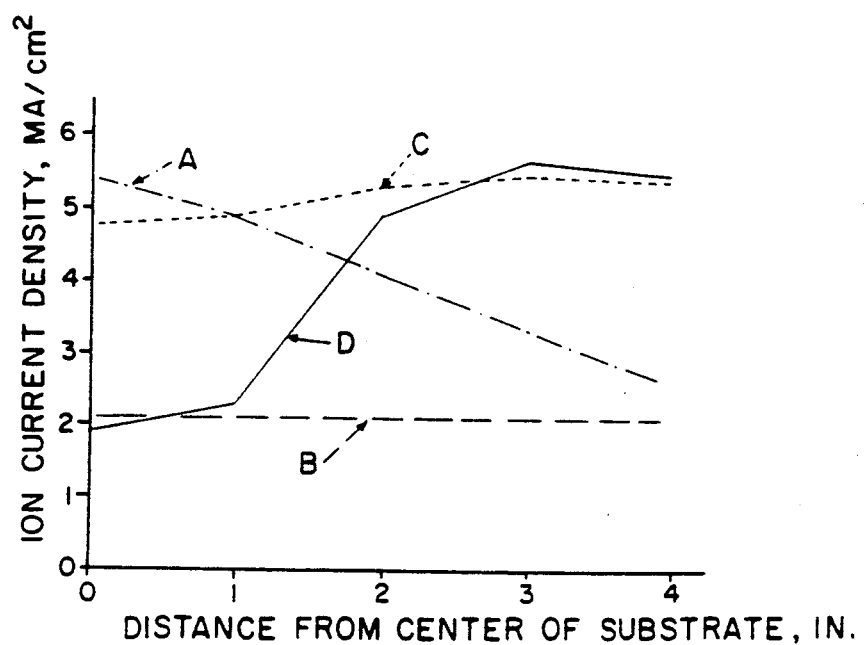
FIG. 4 is a comparative graph illustrating ion flux distribution according to the present invention.

In bias sputtering applications, particularly magnetron enhanced of FIGS. 2 and 2A, where a negative bias is applied to the wafer 21, 21A through conductors 110, 110A to cause the surface 22, 22A of the wafer 21, 21A to be subjected to a secondary ion flux, uniformity of this ion flux on the substrate must be maintained across the wafer surface 22, 22A so that uniform processing of the wafer coating is achieved. Non-uniformity of this flux is caused, in part at least, or is at least intensified by, the shape of the magnetic field in the vicinity of the substrate surface 22 produced by the magnets 51 and 52. Correction of this phenomenon by the use of a countermagnet at the substrate was taught in U.S. Pat. No. 4,871,433. Curves A and B of FIG. 4 illustrate the ion flux distribution on a substrate with and without the countermagnet of U.S. Pat. No. 4,871,433.

In accordance with the present invention, a central electrode, such as electrode 70, 70A, is biased to a relatively small negative voltage, found to be in the range of up to −20 volts in magnitude, but adjusted to an optimum value. It has been found that the value of this voltage or the electrode 70, 70A can be optimized so as to cancel effects which produce non-uniform ion flux onto the substrates 21, 21A, thereby rendering it uniform without the need for a countermagnet, and while still effectively absorbing stray electrons near the center of the target 40, 40A. Furthermore, higher ion flux levels onto the substrate can be maintained than with the countermagnet solution, as shown by curve C of FIG. 4. As a result of the invention, the ion flux level is increased by 250% over that of the countermagnet system. In addition, the large countermagnet assembly which is often difficult to fit into many sputtering devices, is eliminated. Furthermore, the voltage of the central electrode 70 can be more easily modulated than can the countermagnet.

The optimum negative voltage bias to the electrode 70, 70A varies with the other parameters of the system, including both geometric and electrical parameters. Accordingly, in the embodiment of FIG. 2, the appropriate voltage of the electrode 70, which is appropriate when the inner plasma 106 is energized, preferably about zero, for example, is not the same as that which is appropriate when the outer plasma 108 is energized, which is approximately −20 volts in the specific example illustrated. Accordingly, as shown in graph D of FIG. 3, the voltage on line 114 to the electrode 70 is switched between zero and −20 volts in synchronism with the switching of the plasmas 106, 108 so that the voltage on the electrode 70 is optimum for each part of the sputtering cycle in the switched plasma system shown. Both the positioning and the biasing of the central electrode 70, 70A affect the ion flux distribution on the substrate and, accordingly, may be changed to optimize the performance of the electrode 70.

Curve D in FIG. 4, for example, illustrates the ion flux distribution on the surface of a wafer 21 with a central anode 70 at ground potential as compared with curve C which is the distribution with the electrode 70 at −20 volts. Both curves are for an electrode 70 with the apparatus of FIGS. 1 and 2 operating with only the outer plasma 108 energized. Preferably, with each anticipated geometric relationship of target 40, 40A, electrode 70, 70A and substrate 21, 21A, the voltage applied to the electrode 70, 70A should be manipulated to adjust for conditions, such as ion flux, at the substrate 21, 21A to determine the optimum voltage settings for use during operation.

The spacing of the electrode 70, 70A is preferably central to the surface of the target 40, 40A, generally on the target axis 27 in the embodiments where the target assembly is annular and the components concentric, and between the target 40 and the substrate 21, usually near to the target surface 41.

Having described the preferred embodiments of the invention, it will be apparent to one skilled in the art that variations are suggested and can be made without departing from its principles.

Accordingly, the following is claimed:

1. A method of improving the uniformity of the ion flux distribution onto a substrate in a bias sputter coating process performed in a vacuum processing chamber in which a target, having an outer rim, is maintained at a cathode potential, an anode is located at least in part outside of the outer rim of the target and maintained at an anode potential, and the substrate faces the target and is maintained at a bias potential, the method comprising the steps of:

providing an electrode between the target and the substrate and remote from the outer rim of the target;

maintaining the electrode at a potential which is independent of the anode and cathode potentials; and adjusting the potential of the electrode with respect to the anode and cathode potentials so as to improve the distribution uniformity of the ion flux onto the substrate.

2. The method of claim 1 further comprising the step of:

measuring the ion flux distribution at the substrate; and selecting in response to the measured flux distribution, a potential for the electrode at which the uniformity of the ion flux distribution on the substrate will be improved; and the adjusting step includes the step of adjusting the potential of the electrode to the selected potential.

3. The method of claim 1 wherein:

the electrode is provided at a position approximately on a line perpendicular to the center of the target.

4. The method of claim 1 wherein:

the electrode is provided at a position near the surface of the target.

5. The method of claim 1 of improving the uniformity of the ion flux distribution onto the substrate where parameters of the process change, further comprising the step of:

readjusting the potential of the electrode, following the change of parameters, so as to improve the distribution uniformity of the ion flux onto the substrate.

6. The method of claim 5 of improving the uniformity of the ion flux distribution onto the substrate where parameters of the process change over the life of the target, further comprising the step of:
   performing the electrode potential readjusting step following the use of the target in the sputter coating process.

7. The method of claim of improving the distribution uniformity of the ion flux onto a substrate in a bias sputter coating process performed in a vacuum processing chamber in which a magnetic field is maintained over the target surface to trap electrons therein and to support a plasma over a region of the target surface from which sputtering is to occur, the magnetic field causing a distribution non-uniformity of the ion flux onto the substrate, and wherein:
   the potential of the electrode is adjusted so as to compensate for the distribution non-uniformity caused by the magnetic field.

8. The method of claim 1 wherein:
   the electrode is maintained at a negative potential of not more than approximately 20 volts with respect to the potential of the anode.

9. A method of sputter coating a substrate in a bias sputter coating process performed in a vacuum processing chamber in which a target, having an outer rim, is maintained at a cathode potential, an anode is located at least in part outside the outer rim of the target and maintained at an anode potential, and the substrate faces the target and is maintained at a bias potential which is negative with respect to the anode potential to cause an ion flux to impinge upon the substrate during the performance of the coating process, the method comprising the steps of:
   providing an electrode between the target and the substrate and remote from the outer rim of the target;
   maintaining the electrode at a potential which is negative with respect to the anode potential and positive with respect to the anode potential and positive with respect to the anode potential and positive with respect to the cathode potential and the bias potential, whereby the uniformity of the ion flux distribution onto the substrate is improved.

10. The method of claim 9 wherein:
   the electrode is maintained at a potential at which the uniformity of the distribution of the ion flux onto the substrate is more uniform than when the electrode is maintained at the anode potential.

11. The method of claim 9 further comprising the step of:
   adjusting the potential of the electrode so as to improve the distribution uniformity of the ion flux onto the substrate.

12. The method of claim 9 in which the target is annular and the region of the target from which sputtering occurs is annular and concentric with the target, wherein:
   the electrode is provided at a location approximately concentric with the target.

13. The method of claim 9 wherein:
   the electrode is provided near the surface of the target.

14. The method of claim 9 in which magnetic field is maintained over the target surface to trap electrons therein and to support a plasma over a region of the target surface, the magnetic field causing a distribution non-uniformity of the ion flux onto the substrate, and wherein:
   the potential of the electrode is selected so as to compensate for the distribution non-uniformity.

15. The method of claim 9 in which different target regions are maintained on a single piece target, each region having a magnetic field selectively maintained thereover to trap electrons therein and to support a plasma over the region of the target surface to cause sputtering from the region when the field is being maintained thereover, wherein:
   the potential of the electrode is changed in accordance with the selective maintenance of the magnetic fields.

16. The method of claim 15 in which the magnetic fields are switched to alternately maintain the fields over the different target regions, wherein:
   the potential of the electrode is alternately switched in synchronism with switching of the magnetic fields alternate selective maintenance of the magnetic fields.

17. The method of claim 16 in which the target is annular and the regions are annular and concentric with the center of the target, wherein:
   the electrode is provided at a position approximately on a line perpendicular to the center of the target.

18. The method of claim 9 wherein:
   the electrode is maintained at a negative potential of not more than approximately 20 volts with respect to the potential of the anode.

19. A sputter coating method of manufacturing coated substrate comprising the steps of:
   sputter coating a substrate in a bias sputter coating process performed in a vacuum processing chamber in which a target, having an outer rim, is maintained at a cathode potential and an anode is located at least in part outside the outer rim of the target and maintained at an anode potential with the substrate facing the target and maintained at a bias potential which is negative with respect to the anode potential to cause an ion flux to impinge upon the substrate during the performance of the coating process;
   providing an electrode between the target and the substrate and remote from the outer rim of the target;
   maintaining the electrode at a potential which is negative with respect to the anode potential and positive with respect to the cathode potential and the bias potential to thereby improve the uniformity of the ion flux distribution onto the substrate.

20. The method of claim 19 wherein:
   electrode is maintained at a potential at which the uniformity of the distribution of the ion flux onto the substrate is more uniform than when the electrode is maintained at the anode potential.

21. The method of claim 19 further comprising the step of:
   adjusting the potential of the electrode so as to improve the distribution uniformity of the ion flux onto the substrate.

22. The method of claim 19 in which the target is annular and the region of the target from which sputtering occurs is annular and concentric with the target, wherein:
   the electrode is provided at a location approximately concentric with the target.

* * * * *